(12) United States Patent  
Nagatomo et al.

(10) Patent No.: US 9,480,144 B2  
(45) Date of Patent: Oct. 25, 2016

(54) POWER MODULE SUBSTRATE, POWER MODULE SUBSTRATE WITH HEAT SINK, AND POWER MODULE

(71) Applicant: MITSUBISHI MATERIALS CORPORATION, Tokyo (JP)

(72) Inventors: Yoshiyuki Nagatomo, Saitama (JP); Nobuyuki Terasaki, Saitama (JP); Yoshirou Kuromitsu, Saitama (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 0 days.

(21) Appl. No.: 14/387,720

(22) PCT Filed: Mar. 29, 2013

(86) PCT No.: PCT/JP2013/059498  
§ 371 (c)(1),  
(2) Date: Sep. 24, 2014

(87) PCT Pub. No.: WO2013/147142  
PCT Pub. Date: Oct. 3, 2013

(65) Prior Publication Data  
US 2015/0034367 A1     Feb. 5, 2015

(30) Foreign Application Priority Data

Mar. 30, 2012 (JP) .................................. 2012-083246  
Mar. 8, 2013 (JP) .................................. 2013-046960

(51) Int. Cl.  
*H05K 1/02*     (2006.01)  
*H05K 1/18*     (2006.01)  
(Continued)

(52) U.S. Cl.  
CPC ............. *H05K 1/0207* (2013.01); *B23K 1/008* (2013.01); *B23K 1/0016* (2013.01); *B23K 1/012* (2013.01);  
(Continued)

(58) Field of Classification Search  
CPC ............... H01L 23/36; H01L 21/4882; H01L 23/4006; H01L 23/473; H01L 23/3735; C04B 37/02; H05K 1/0207; H05K 1/0254; H05K 1/092; H05K 1/18; H05K 2201/066; H05K 1/0201; H05K 1/0203; H05K 1/0204; H05K 1/0206; H05K 1/0209; H05K 1/021; H05K 1/0272; H05K 1/0212; H05K 1/05; H05K 2201/064; H05K 2201/068; H05K 2201/09054; H05K 2201/09772; H05K 2201/09872; B23K 1/0012; B23K 1/0016; B23K 1/008; B23K 20/023; B23K 20/16; B23K 20/2333  
USPC ......... 174/250–268; 361/715, 760, 792–795; 257/712  
See application file for complete search history.

(56) References Cited

U.S. PATENT DOCUMENTS 8,044,500 B2 * 10/2011 Kitahara et al. .............. 257/691  
2002/0109152 A1 * 8/2002 Kobayashi et al. .......... 257/177  
(Continued)

FOREIGN PATENT DOCUMENTS

CN     1832157 A      9/2006  
CN     101061580 A    10/2007  
(Continued)

OTHER PUBLICATIONS

International Search Report mailed Jun. 25, 2013, issued for PCT/JP2013/059498 and English translation thereof.  
(Continued)

*Primary Examiner* — Ishwarbhai B Patel  
(74) *Attorney, Agent, or Firm* — Locke Lord LLP; James E. Armstrong, IV; Nicholas J. DiCeglie, Jr.

(57) ABSTRACT

A power module substrate including an insulating substrate, a circuit layer formed on one surface of the insulating substrate, and a metal layer formed on the other surface of the insulating substrate, wherein the circuit layer is composed of copper or a copper alloy, one surface of this circuit layer functions as an installation surface on which an electronic component is installed, the metal layer is formed by bonding an aluminum sheet composed of aluminum or an aluminum alloy, a thickness $t_1$ of the circuit layer is within a range of 0.1 mm ≤ $t_1$ ≤ 0.6 mm, a thickness $t_2$ of the metal layer is within a range of 0.5 mm ≤ $t_2$ ≤ 6 mm, and the relationship between the thickness $t_1$ of the circuit layer and the thickness $t_2$ of the metal layer satisfies $t_1 < t_2$.

8 Claims, 6 Drawing Sheets

(51) Int. Cl.
| | |
|---|---|
| H01L 23/36 | (2006.01) |
| H01L 23/373 | (2006.01) |
| H01L 23/40 | (2006.01) |
| H01L 23/473 | (2006.01) |
| H05K 1/09 | (2006.01) |
| B23K 1/012 | (2006.01) |
| B23K 1/00 | (2006.01) |
| B23K 1/008 | (2006.01) |
| B23K 20/02 | (2006.01) |
| B23K 20/16 | (2006.01) |
| B23K 20/233 | (2006.01) |
| H01L 21/48 | (2006.01) |
| C04B 37/02 | (2006.01) |
| H01L 23/00 | (2006.01) |

(52) U.S. Cl.
CPC ............ *B23K 20/023* (2013.01); *B23K 20/16* (2013.01); *B23K 20/2333* (2013.01); *C04B 37/021* (2013.01); *C04B 37/026* (2013.01); *H01L 21/4882* (2013.01); *H01L 23/36* (2013.01); *H01L 23/3735* (2013.01); *H01L 23/4006* (2013.01); *H01L 23/473* (2013.01); *H05K 1/0203* (2013.01); *H05K 1/0254* (2013.01); *H05K 1/092* (2013.01); *H05K 1/18* (2013.01); *B23K 2201/42* (2013.01); *B23K 2203/10* (2013.01); *B23K 2203/18* (2013.01); *C04B 2237/124* (2013.01); *C04B 2237/125* (2013.01); *C04B 2237/128* (2013.01); *C04B 2237/343* (2013.01); *C04B 2237/366* (2013.01); *C04B 2237/368* (2013.01); *C04B 2237/407* (2013.01); *C04B 2237/54* (2013.01); *C04B 2237/60* (2013.01); *H01L 24/29* (2013.01); *H01L 24/32* (2013.01); *H01L 2224/29111* (2013.01); *H01L 2224/32225* (2013.01); *H01L 2924/13055* (2013.01); *H05K 2201/066* (2013.01)

(56) References Cited

U.S. PATENT DOCUMENTS

| | | | |
|---|---|---|---|
| 2003/0025195 | A1 | 2/2003 | Nakamura et al. |
| 2007/0274047 | A1* | 11/2007 | Nagase et al. ............... 361/704 |
| 2009/0056996 | A1* | 3/2009 | Kato ................... H01L 23/3735 174/260 |
| 2009/0134205 | A1* | 5/2009 | Kimbara ................ H01L 24/29 228/180.21 |
| 2009/0200065 | A1* | 8/2009 | Otoshi .................. H01L 23/367 174/252 |
| 2010/0013086 | A1 | 1/2010 | Obiraki et al. |
| 2010/0134979 | A1 | 6/2010 | Obiraki et al. |

FOREIGN PATENT DOCUMENTS

| | | |
|---|---|---|
| CN | 101218671 A | 7/2008 |
| DE | 102008000825 A1 | 10/2009 |
| DE | 102009032973 A1 | 1/2010 |
| EP | 1523037 A2 | 4/2005 |
| EP | 2315242 A1 | 4/2011 |
| JP | 04-162756 A | 6/1992 |
| JP | 3171234 B2 | 5/2001 |
| JP | 2002-076551 A | 3/2002 |
| JP | 2003-197826 A | 7/2003 |
| JP | 2004-221547 A | 8/2004 |
| JP | 2007-081202 A | 3/2007 |
| JP | 2007-299974 A | 11/2007 |
| JP | 2008-192823 A | 8/2008 |
| JP | 2008-227336 A | 9/2008 |
| JP | 2009-277990 A | 11/2009 |
| JP | 2010-093225 A | 4/2010 |
| JP | 2010-238932 A | 10/2010 |
| JP | 2012-023404 A | 2/2012 |
| JP | 2012-064801 A | 3/2012 |

OTHER PUBLICATIONS

Notice of Reasons for Rejection mailed Jan. 14, 2014, issued for the Japanese patent application No. 2013-046960 and English translation thereof.
Office Action mailed Jun. 16, 2015, issued for the Japanese patent application No. 2014-052676 and English translation thereof.
Office Action mailed Aug. 4, 2015, issued for the Japanese patent application No. 2014-179564 and English translation thereof.
Extended European Search Report issued in corresponding European Patent Application No. EP 13768844.6 dated Dec. 1, 2015.
Search Report dated Jun. 6, 2016, issued by The State Intellectual Property Office of P.R. China, in corresponding Chinese Patent Application No. 201380015211.6.
Decision of Rejection, issued in corresponding Japanese Patent Application No. JP 2014-179564, dated Mar. 8, 2016.

* cited by examiner

POWER MODULE SUBSTRATE, POWER MODULE SUBSTRATE WITH HEAT SINK, AND POWER MODULE

TECHNICAL FIELD

The present invention relates to a power module substrate, a power module substrate with a heat sink, and a power module, which are used in semiconductor devices for controlling large currents and high voltages.

Priority is claimed on Japanese Patent Application No. 2012-083246, filed Mar. 30, 2012 and Japanese Patent Application No. 2013-046960, filed Mar. 8, 2013, the contents of which are incorporated herein by reference.

BACKGROUND ART

Among semiconductor elements, power modules used for supplying electric power exhibit comparatively high levels of heat generation, and the substrate on which these power modules are installed is typically a power module substrate having an insulating substrate formed from AlN (aluminum nitride), $Al_2O_3$ (alumina) or $Si_3N_4$ (silicon nitride) or the like, a circuit layer formed by bonding a first metal sheet to one surface of the insulating substrate, and a metal layer formed by bonding a second metal sheet to the other surface of the insulating substrate.

In this type of power module substrate, a power element semiconductor element is installed on the top of the circuit layer via a solder material.

Further, a heat sink for cooling the power module substrate is bonded to the other surface of the metal layer.

For example, Patent Document 1 proposes a power module substrate in which the first metal sheet and the second metal sheet which constitute the circuit layer and the metal layer respectively are copper sheets, and these copper sheets are bonded directly to the insulating substrate using a DBC method. Further, as illustrated in FIG. 1 of Patent Document 1, by bonding an aluminum heat sink to this power module substrate using an organic heat-resistant adhesive, a power module substrate with a heat sink is obtained.

Further, Patent Document 2 proposes a power module substrate in which aluminum sheets are used as the first metal sheet and the second metal sheet which constitute the circuit layer and the metal layer respectively. By bonding a heat sink to the metal layer of this power module substrate by brazing, a power module substrate with a heat sink can be formed.

Furthermore, Patent Document 3 proposes a power module substrate in which a metal sheet is bonded to one surface of an insulating substrate to form a circuit layer, and a casting method is used to form an aluminum heat sink directly on the other surface of the insulating substrate. Patent Document 3 also discloses the use of an aluminum sheet or a copper sheet as the metal sheet for forming the circuit layer.

PRIOR ART DOCUMENTS

Patent Documents

Patent Document 1: Japanese Unexamined Patent Application, First Publication No. H04-162756
Patent Document 2: Japanese Patent (Granted) Publication No. 3,171,234
Patent Document 3: Japanese Unexamined Patent Application, First Publication No. 2002-076551

DISCLOSURE OF INVENTION

Problems to be Solved by the Invention

However, in the power module substrate and the power module substrate with a heat sink disclosed in Patent Document 1, because a copper sheet is disposed between the aluminum heat sink and the insulating substrate, thermal strain caused by the difference in the coefficients of thermal expansion of the heat sink and the insulating substrate cannot be satisfactorily alleviated by the copper sheet, meaning the insulating substrate is prone to cracking during thermal cycle loading.

Moreover, Patent Document 1 discloses that the organic heat-resistant adhesive interposed between the heat sink and the metal layer moderates thermal strain, but the inclusion of this organic heat-resistant adhesive increases the thermal resistance, and therefore the heat from a heat-generating body such as an electrical component installed on top of the circuit layer is unable to dissipate efficiently into the heat sink.

Further, in the power module substrate and the power module substrate with a heat sink disclosed in Patent Document 2, an aluminum sheet is used as the first metal sheet which constitutes the circuit layer.

A comparison of copper and aluminum reveals that aluminum has a lower thermal conductivity, and therefore when an aluminum sheet is used as the first metal sheet which constitutes the circuit layer, the dispersion and dissipation of heat from a heat-generating body such as an electrical component installed on top of the circuit layer is inferior to that observed for copper.

As a result, as the power density increases due to the miniaturization and increased power output of electronic components, there is a possibility that the heat may not be able to be dissipated satisfactorily. Accordingly, there is a chance that the durability may deteriorate when the device is subjected to power cycle loads.

Moreover, in the power module substrate with a heat sink disclosed in Patent Document 3, because the aluminum heat sink is bonded directly to the insulating substrate, thermal strain caused by the difference in the coefficients of thermal expansion of the heat sink and the insulating substrate tend to cause cracking of the insulating substrate. In order to prevent such cracking, it is necessary to lower the proof stress of the heat sink in Patent Document 3. As a result, the strength of the heat sink itself tends to be inadequate, and handling becomes extremely difficult.

Further, because the heat sink is formed using a casting method, the structure of the heat sink is comparatively simple, and therefore a heat sink having a superior cooling capability cannot be formed, and the dissipation of heat cannot be promoted.

The present invention has been developed in light of the above circumstances, and has an object of providing a power module substrate, a power module substrate with a heat sink and a power module, which can promote the dissipation of heat from a heat-generating body such as an electronic component installed on the circuit layer, have excellent power cycle characteristics, and have superior reliability capable of suppressing cracking of the insulating substrate during cooling-heating cycle loading.

Means to Solve the Problems

In order to address the problems outlined above and achieve the above object, a power module substrate of the present invention includes an insulating substrate, a circuit layer formed on one surface of the insulating substrate, and a metal layer formed on the other surface of the insulating substrate, wherein the circuit layer is composed of copper or a copper alloy, one surface of the circuit layer functions as an installation surface on which an electronic component is installed, the metal layer is formed by bonding an aluminum sheet composed of aluminum or an aluminum alloy, a thickness $t_1$ of the circuit layer is within a range of 0.1 mm≤$t_1$≤0.6 mm, a thickness $t_2$ of the metal layer is within a range of 0.5 mm≤$t_2$≤6 mm, and the relationship between the thickness $t_1$ of the circuit layer and the thickness $t_2$ of the metal layer satisfies $t_1$<$t_2$.

In the power module substrate of the configuration described above, because the thickness $t_1$ of the circuit layer composed of copper or a copper alloy having a comparatively large deformation resistance is 0.1 mm or greater, a large current can flow through the layer, enabling power elements to be installed. Further, because the thickness $t_1$ of the circuit layer is not more than 0.6 mm, the insulating substrate is not constrained more than is necessary by the circuit layer, enabling cracking of the insulating substrate to be suppressed.

Further, because the thickness $t_2$ of the metal layer composed of aluminum or an aluminum alloy having a comparatively small deformation resistance is 0.5 mm or greater, any stress applied to the power module substrate due to deformation of the metal layer is moderated, and cracking of the insulating substrate can be suppressed. Further, because the thickness $t_2$ of the metal layer is not more than 6 mm, thermal resistance in the metal layer can be suppressed to a low level. From this viewpoint, the thickness $t_2$ of the metal layer is preferably not more than 3 mm.

Moreover, because the relationship between the thickness $t_1$ of the circuit layer and the thickness $t_2$ of the metal layer satisfies $t_1$<$t_2$, warping in the power module substrate can be suppressed.

For example, even when a heat sink is bonded to the metal layer side of this power module substrate, thermal strain caused by the difference in the coefficients of thermal expansion of the insulating substrate and the heat sink can be alleviated by deformation of the adequately thick metal layer, and because the insulating substrate itself is not strongly constrained by the circuit layer, cracking of the insulating substrate can be suppressed.

Furthermore, in the power module substrate described above, because the circuit layer, having the installation surface onto which an electronic component is installed, is composed of copper or a copper alloy, heat generated from the electronic component can be satisfactorily dispersed, and dissipation of the heat can be accelerated. Accordingly, the durability of the power module substrate when subjected to power cycle loading can be improved.

The relationship between the thickness $t_1$ of the circuit layer and the thickness $t_2$ of the metal layer preferably satisfies $t_2/t_1$≥2.5.

In this case, because the relationship between the thickness $t_1$ of the circuit layer composed of copper or a copper alloy and the thickness $t_2$ of the metal layer composed of aluminum or an aluminum alloy satisfies $t_2/t_1$≥2.5, the occurrence of warping in the power module substrate can be reliably inhibited.

Furthermore, within the metal layer, one or more additional elements selected from among Si, Cu, Ag, Zn, Mg, Ge, Ca, Ga and Li preferably exist in solid solution in the vicinity of the bonding interface with the insulating substrate, and the total concentration of the additional elements in the metal layer in the vicinity of the bonding interface is preferably set within a range from at least 0.01% by mass to not more than 5% by mass.

In this case, because one or more additional elements selected from among Si, Cu, Ag, Zn, Mg, Ge, Ca, Ga and Li exist in solid solution in the metal layer, and because the total concentration of the additional elements in the metal layer in the vicinity of the bonding interface is at least 0.01% by mass, the portion of the metal layer on the side of the bonding interface undergoes solid solution strengthening. Further, because the total concentration of the additional elements in the metal layer in the vicinity of the bonding interface is not more than 5% by mass, the strength of the bonding interface region of the metal layer can be prevented from becoming excessively high, meaning when the power module substrate is subjected to thermal cycle loading, the thermal strain can be moderated by the metal layer, thereby suppressing cracking of the insulating substrate.

Moreover, within the metal layer, an additional element high-concentration section in which the concentration of one or more additional elements selected from among Si, Cu, Ag, Zn, Mg, Ge, Ca, Ga and Li is two or more times the concentration of the additional elements in the metal layer is preferably formed in the vicinity of the bonding interface with the insulating substrate.

In this case, because this high-concentration section in which the concentration of the aforementioned additional elements is two or more times the concentration of the additional elements in the metal layer is formed at the bonding interface of the metal layer, the existence of these additional element atoms in the vicinity of the interface can increase the bonding strength of the metal layer. The concentration of the additional elements in the metal layer refers to the concentration of the additional elements in a portion of the metal layer at a prescribed distance (for example, 5 nm or greater) from the bonding interface.

Furthermore, the indentation hardness $H_{B1}$ of the aforementioned circuit layer in the vicinity of the bonding interface with the insulating substrate is preferably within a range of 60 mgf/μm²≤$H_{B1}$≤120 mgf/μm².

In this case, because the indentation hardness $H_{B1}$ of the circuit layer in the vicinity of the bonding interface with the insulating substrate is at least 60 mgf/μm², the strength of the circuit layer in the vicinity of the bonding interface can be ensured, and cracking of the circuit layer itself is prevented. Further, because the indentation hardness $H_{B1}$ is not more than 120 mgf/μm², the insulating substrate is not strongly constrained by the circuit layer, thereby suppressing cracking of the insulating substrate.

Further, the indentation hardness $H_{B2}$ of the aforementioned metal layer in the vicinity of the bonding interface with the insulating substrate is preferably within a range of 30 mgf/μm²≤$H_{B2}$≤80 mgf/μm².

In this case, because the indentation hardness $H_{B2}$ of the metal layer in the vicinity of the bonding interface with the insulating substrate is at least 30 mgf/μm², the strength of the metal layer in the vicinity of the bonding interface can be ensured, and cracking of the metal layer itself is prevented. Further, because the indentation hardness $H_{B2}$ is not more than 80 mgf/μm², the deformation resistance of the metal layer can be suppressed to a low level, meaning stress can be alleviated by deformation of the metal layer, thereby suppressing cracking of the insulating substrate.

The indentation hardness $H_{B1}$ of the circuit layer in the vicinity of the bonding interface and the indentation hardness $H_{B2}$ of the metal layer in the vicinity of the bonding interface are measured at positions 50 μm from the bonding interface, and are measured under the following measurement conditions.

Measurement apparatus: ENT-1100a, manufactured by Elionix Inc.

Indenter: Berkovich triangular pyramidal indenter

Test load: 5,000 mgf

Number of steps: 500 steps
Step interval: 20 msec
Temperature: 27° C.
Mode: load-unload test
Measured value: HIT=maximum load/projected cross-sectional area of contact A power module substrate with a heat sink according to the present invention includes the power module substrate described above and a heat sink which is bonded to the metal layer side of the substrate.

By using a power module substrate with a heat sink of this configuration, the metal layer produced by bonding the aluminum sheet composed of aluminum or an aluminum alloy is interposed between the heat sink and the insulating substrate, and because the thickness $t_2$ of this metal layer is within the range of 0.5 mm≤$t_2$≤6 mm, thermal strain caused by the difference in the coefficients of thermal expansion of the insulating substrate and the heat sink can be moderated by deformation of the metal layer, enabling cracking of the insulating substrate to be suppressed.

In the power module substrate with a heat sink according to the present invention, the heat sink and the metal layer may also be bonded together via a solder layer.

In this case, the power module substrate has the circuit layer composed of copper or a copper alloy, and the metal layer composed of aluminum or an aluminum alloy, and because the thickness $t_1$ of the circuit layer and the thickness $t_2$ of the metal layer are prescribed in the manner described above, the rigidity of the power module substrate can be ensured, the power module substrate is resistant to deformation when subjected to thermal cycle loading, and cracking of the solder layer can be suppressed.

A power module of the present invention includes the power module substrate described above, and an electronic component installed on the aforementioned circuit layer.

By using a power module of this configuration, heat from the electronic component installed on the circuit layer can be diffused efficiently, and even if the power density (amount of heat generation) of the electronic component is increased, the power module can satisfactorily cope with the increased heat. Further, the durability of the power module upon power cycle loading can be improved.

Effects of the Invention

The present invention is able to provide a power module substrate, a power module substrate with a heat sink and a power module, which can promote the dissipation of heat from a heat-generating body such as an electronic component installed on the circuit layer, have excellent power cycle characteristics, and have superior reliability capable of suppressing cracking of the insulating substrate during cooling-heating cycle loading.

BEST MODE FOR CARRYING OUT THE INVENTION

Embodiments of the present invention are described below with reference to the appended drawings.

Figure 1:
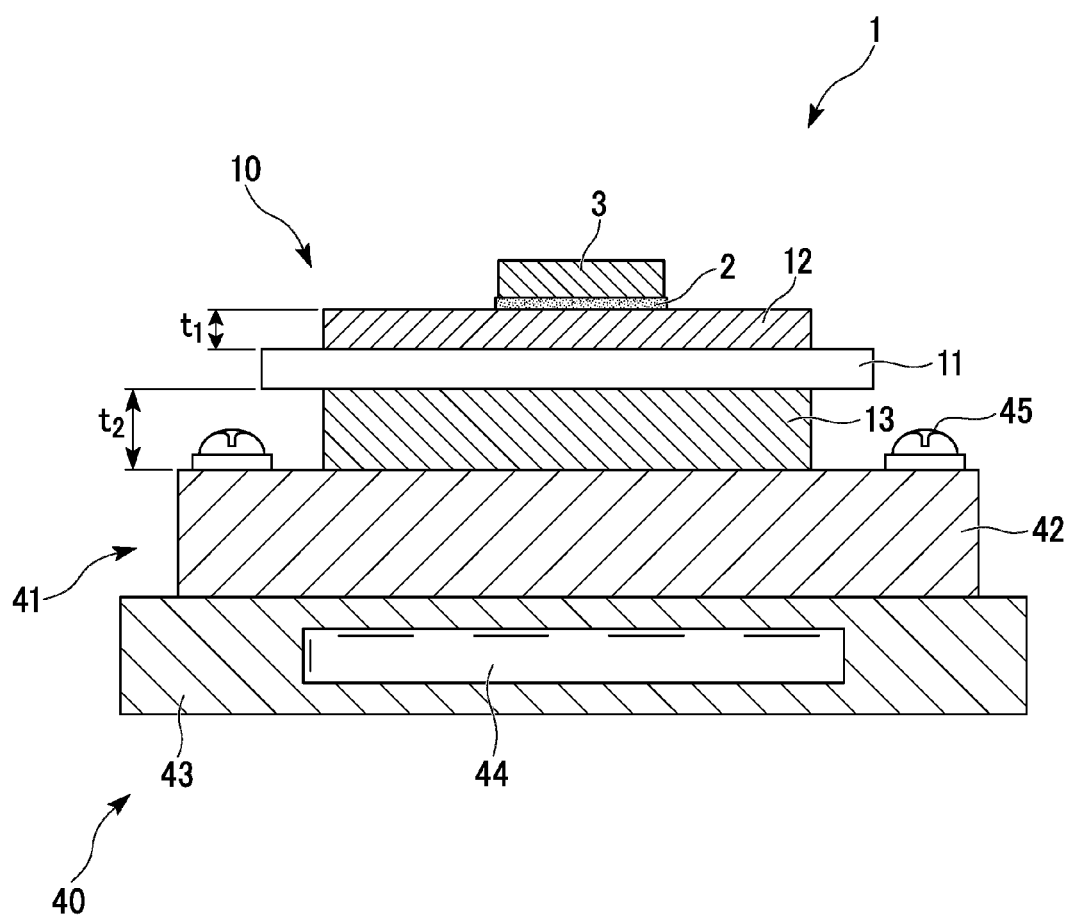
FIG. 1 is a schematic explanatory diagram of a power module using a power module substrate according to a first embodiment of the present invention.

FIG. 1 illustrates a power module substrate 10, a power module substrate with a heat sink 40, and a power module 1 using the power module substrate 10 according to a first embodiment of the present invention.

This power module 1 includes the power module substrate with a heat sink 40, and a semiconductor element (electronic component) 3 which is bonded to one surface (the upper surface in FIG. 1) of this power module substrate with a heat sink 40 via a solder layer 2.

The solder layer 2 is composed of a Sn—Ag-based, Sn—In-based, or Sn—Ag—Cu-based solder material.

The power module substrate with a heat sink 40 includes the power module substrate 10 and a heat sink 41 which cools the power module substrate 10.

In this embodiment, the heat sink 41 includes a top plate section 42 which is bonded to the power module substrate 10, and a cooling member 43 which is laminated on the top plate section 42. A channel 44 through which a cooling medium is circulated is formed inside the cooling member 43.

The top plate section 42 and the cooling member 43 are linked together by fixing screws 45. As a result, the top plate section 42 requires sufficient rigidity that it does not easily deform upon screwing in the fixing screws 45. Accordingly, in this embodiment, the top plate section 42 of the heat sink 41 is formed from a metal material having a proof stress of at least 100 N/mm$^2$, and the thickness of the top plate section 42 is at least 2 mm. In the present embodiment, the top plate section 42 is formed from A6063 alloy (an aluminum alloy).

The power module substrate 10 includes an insulating substrate 11, a circuit layer 12 disposed on one surface (the upper surface in FIG. 1) of this insulating substrate 11, and a metal layer 13 disposed on the other surface (the lower surface in FIG. 1) of the insulating substrate 11.

The insulating substrate 11 prevents electrical connection between the circuit layer 12 and the metal layer 13, and is formed, for example, from a ceramic having superior insulating properties such as AlN (aluminum nitride), $Si_3N_4$ (silicon nitride) or $Al_2O_3$ (alumina). In the present embodiment, the insulating substrate 11 is composed of $Al_2O_3$ (alumina). Further, the thickness of the insulating substrate 11 is set within a range from 0.2 mm to 1.5 mm, and in the present embodiment is set to 0.635 mm.

Figure 3:
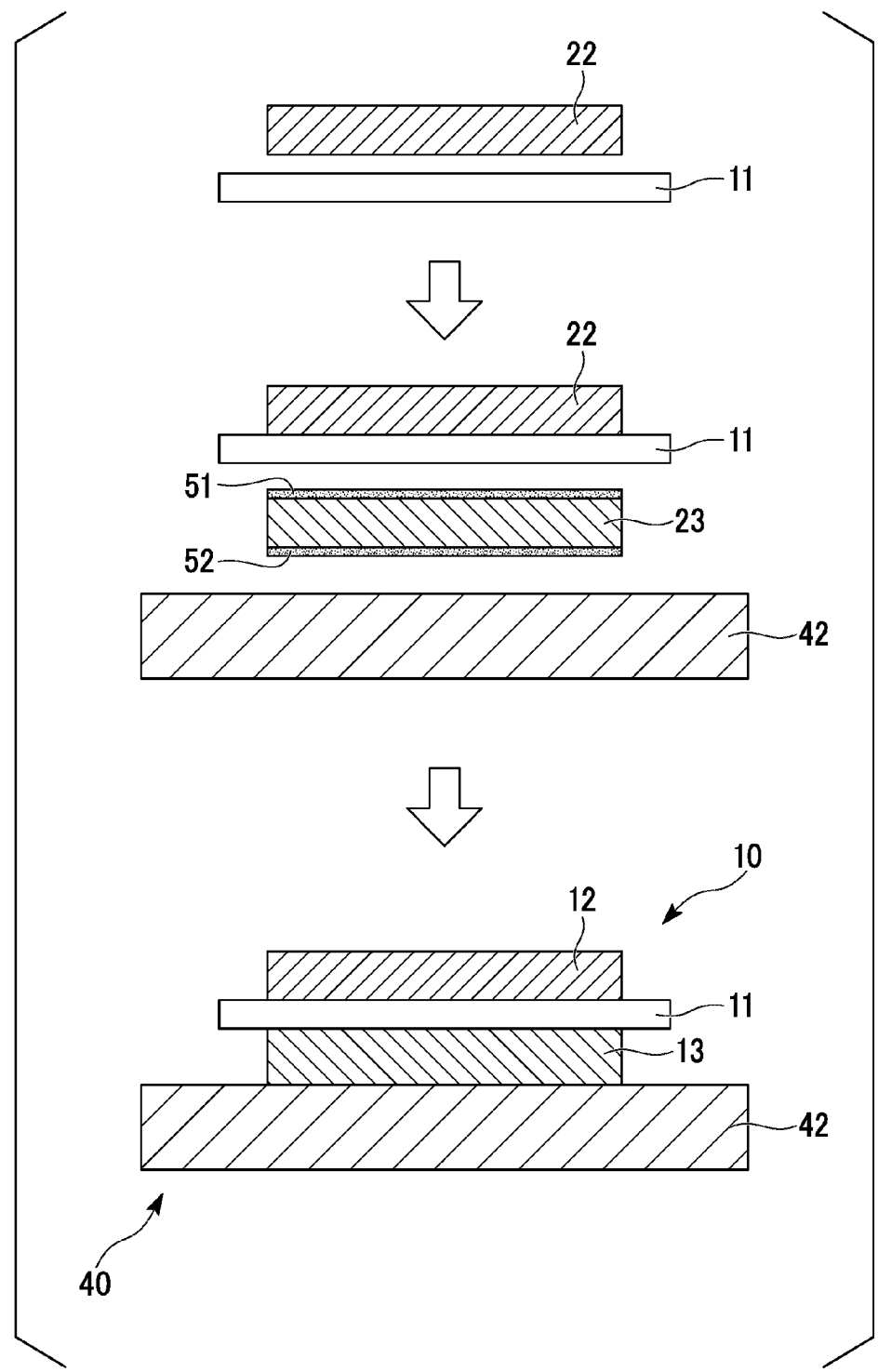
FIG. 3 is an explanatory diagram illustrating the method of producing the power module substrate and the power module substrate with a heat sink according to the first embodiment of the present invention.

The circuit layer 12 is formed by bonding a copper sheet 22 composed of copper or a copper alloy to one surface of the insulating substrate 11. In this embodiment, as illustrated in FIG. 3, a rolled sheet of tough pitch copper is used as the copper sheet 22 that constitutes the circuit layer 12. A circuit pattern is formed in the circuit layer 12, and one surface (the upper surface in FIG. 1) of that circuit pattern functions as an installation surface onto which the semiconductor element 3 is installed.

The metal layer 13 is formed by bonding an aluminum sheet 23 composed of aluminum or an aluminum alloy to the other surface of the insulating substrate 11. In this embodiment, as illustrated in FIG. 3, a rolled sheet of aluminum with a purity of at least 99.99% (so-called 4N aluminum) is used as the aluminum sheet 23 that constitutes the metal layer 13. This aluminum sheet 23 has a 0.2% proof stress of not more than 30 N/mm$^2$.

The thickness $t_1$ of the circuit layer 12 (the copper sheet 22) is set within a range of $0.1 \text{ mm} \le t_1 \le 0.6 \text{ mm}$, the thickness $t_2$ of the metal layer 13 (the aluminum sheet 23) is set within a range of $0.5 \text{ mm} \le t_2 \le 6 \text{ mm}$, and the relationship between the thickness $t_1$ of the circuit layer 12 and the thickness $t_2$ of the metal layer 13 satisfies $t_1 < t_2$. The relationship between the thickness $t_1$ of the circuit layer 12 and the thickness $t_2$ of the metal layer 13 preferably also satisfies $t_2/t_1 \ge 2.5$. The thickness $t_1$ is more preferably within a range of $0.2 \text{ mm} \le t_1 \le 0.4 \text{ mm}$, and the thickness $t_2$ is more preferably within a range of $0.6 \text{ mm} \le t_2 \le 3.0 \text{ mm}$. There are no particular limitations on the upper limit for $t_2/t_1$, but a value of not more than 10 is preferable.

In this embodiment, the thickness $t_1$ of the circuit layer 12 (the copper sheet 22) is set to $t_1 = 0.3 \text{ mm}$, and the thickness $t_2$ of the metal layer 13 (the aluminum sheet 23) is set to $t_2 = 2.0 \text{ mm}$, so that $t_2/t_1 = 6.67$.

Further, in the present embodiment, the indentation hardness $H_{B1}$ of the circuit layer 12 in the vicinity of the bonding interface with the insulating substrate 11 is set within a range of $60 \text{ mgf/}\mu\text{m}^2 \le H_{B1} \le 120 \text{ mgf/}\mu\text{m}^2$.

Moreover, the indentation hardness $H_{B2}$ of the metal layer 13 in the vicinity of the bonding interface with the insulating substrate 11 is set within a range of $30 \text{ mgf/}\mu\text{m}^2 \le H_{B2} \le 80 \text{ mgf/}\mu\text{m}^2$.

Moreover, within the metal layer 13, one or more additional elements selected from among Si, Cu, Ag, Zn, Mg, Ge, Ca, Ga and Li exist in solid solution in the vicinity of the bonding interface with the insulating substrate 11, and in this embodiment, Cu is used as the additional element in solid solution.

The concentration of the additional element (the Cu concentration in this embodiment) in the metal layer 13 in the vicinity of the bonding interface is set within a range from at least 0.01% by mass to not more than 5% by mass. This concentration of the additional element in the metal layer 13 in the vicinity of the bonding interface is measured by EPMA analysis (spot diameter: 30 μm), and is reported as the average value of 5 measurements taken at positions 50 μm form the surface of the metal layer 1.

Further, in the vicinity of the bonding interface between the metal layer 13 and the top plate section 42 of the heat sink 41, one or more additional elements selected from among Si, Cu, Ag, Zn, Mg, Ge, Ca, Ga and Li exist in solid solution within the metal layer 13 and the top plate section 42, and in this embodiment, Cu is used as the additional element in solid solution.

The concentration of the additional element (the Cu concentration in this embodiment) in the metal layer 13 and the top plate section 42 in the vicinity of the bonding interface is set within a range from at least 0.01% by mass to not more than 5% by mass. These concentrations of the additional element in the metal layer 13 and the top plate section 42 in the vicinity of the bonding interface are measured by EPMA analysis (spot diameter: 30 μm), and are reported as the average value of 5 measurements taken at positions 50 μm from the bonding interface.

Furthermore, observation of the bonding interface between the insulating substrate 11 and the metal layer 13 using a transmission electron microscope confirms that an additional element high-concentration section having an increased concentration of the additional element (Cu) is formed at the bonding interface. In this additional element high-concentration section, the concentration of the additional element (Cu concentration) is two or more times the concentration of the additional element (Cu concentration) in the metal layer 13. The thickness H of this additional element high-concentration section is not more than 4 nm. Further, although there are no particular limitations on the ratio of the concentration of the additional element in the additional element high-concentration section relative to the concentration of the additional element in the metal layer 13, the upper limit is preferably approximately 200.

In terms of the bonding interface that is observed, the center between the interface side edge of the lattice image of the metal layer 13 and the bonding interface side edge of the lattice image of the insulating substrate 11 is taken as a reference surface S. Further, the concentration of the additional element (Cu concentration) in the metal layer 13 refers to the concentration of the additional element (Cu Concentration) in a portion of the metal layer 13 separated from the bonding interface by a prescribed distance (5 nm in this embodiment). The concentration of the additional element in the additional element high-concentration section and the concentration of the additional element in the metal layer 13 may be measured using the same method as that used to measure the concentration of the additional element in the vicinity of the bonding interface.

Figure 2:
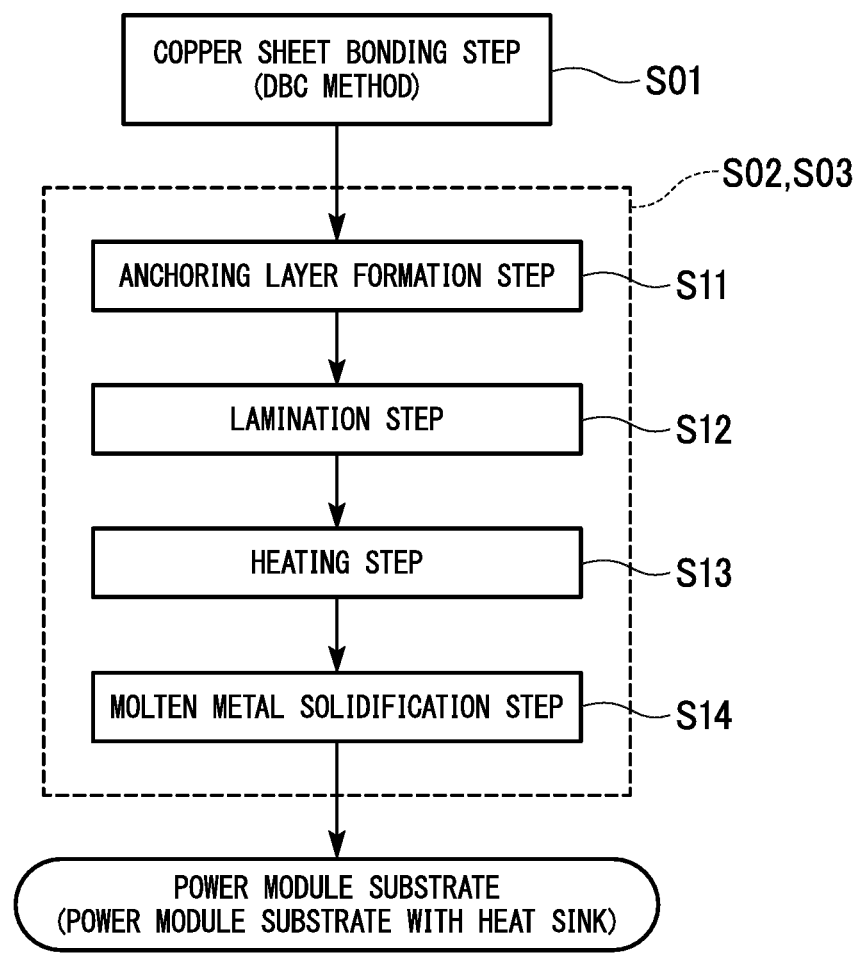
FIG. 2 is a flow chart for a method of producing the power module substrate and a power module substrate with a heat sink according to the first embodiment of the present invention.

A method of producing the power module substrate 10 of the configuration described above and the power module substrate with a heat sink 40 is described below with reference to FIG. 2 and FIG. 3.

First, as illustrated in FIG. 3, the copper sheet 22 that becomes the circuit layer 12 is bonded to the insulating substrate 11 (copper sheet bonding step S01). Because the insulating substrate 11 is composed of $Al_2O_3$, the copper sheet 22 and the insulating substrate 11 are bonded using a DBC method which utilizes a eutectic reaction between copper and oxygen.

Specifically, the copper sheet 22 formed from tough pitch copper and the insulating substrate 11 are brought into mutual contact, and by performing heating at 1,075° C. for 10 minutes in a nitrogen gas atmosphere, the copper sheet 22 and the insulating substrate 11 are bonded together.

Next, the aluminum sheet 23 that becomes the metal layer 13 is bonded to the other surface of the insulating substrate 11 (aluminum sheet bonding step S02), and the aluminum sheet 23 and the top plate section 42 of the heat sink 41 are also bonded together (heat sink bonding step S03). In the present embodiment, the aluminum sheet bonding step S02 and the heat sink bonding step S03 are performed simultaneously.

An additional element (Cu) is adhered by sputtering to the surface of the aluminum sheet 23 to which the insulating substrate 11 is to be bonded, thus forming a first anchoring layer 51, and an additional element (Cu) is also adhered by sputtering to the surface of the aluminum sheet 23 to which the top plate section 42 of the heat sink 41 is to be bonded, thus forming a second anchoring layer 52 (anchoring layer formation step S11). The amount of the additional element in the first anchoring layer 51 and the second anchoring layer 52 is within a range from 0.01 mg/cm$^2$ to 10 mg/cm$^2$. In this embodiment, Cu is used as the additional element, and the amount of Cu in the first anchoring layer 51 and the second anchoring layer 52 is set to at least 0.08 mg/cm² but not more than 2.7 mg/cm².

Next, as illustrated in FIG. 3, the aluminum sheet 23 is laminated to the other surface of the insulating substrate 11. Moreover, the top plate section 42 of the heat sink 41 is laminated to the other surface of the aluminum sheet 23 (lamination step S12).

At this time, as illustrated in FIG. 3, the lamination is performed with the surface of the aluminum sheet 23 on which the first anchoring layer 51 has been formed facing the insulating substrate 11, and the surface of the aluminum sheet 23 on which the second anchoring layer 52 has been formed facing the top plate section 42.

Subsequently, the insulating substrate 11 with the copper sheet 22 bonded thereto, the aluminum sheet 23 and the top plate section 42 are heated in a vacuum heating furnace with pressure applied in the lamination direction (pressure: 1 to 35 kgf/cm²) (heating step S13). In the present embodiment, the pressure inside the vacuum heating furnace is set within a range from $10^{-3}$ to $10^{-6}$ Pa, and the heating temperature is set within a range from at least 550° C. to not more than 650° C.

By so doing, the additional element (Cu) of the first anchoring layer 51 diffuses into the aluminum sheet 23, thereby forming a first molten metal region at the interface between the aluminum sheet 23 and the insulating substrate 11.

Further, the additional element (Cu) of the second anchoring layer 52 diffuses into the aluminum sheet 23 and the top plate section 42, thereby forming a second molten metal region at the interface between the aluminum sheet 23 and the top plate section 42.

Next, in the state where the first molten metal region and the second molten metal region have been formed, the temperature is held at a constant value (molten metal solidification step S14).

By so doing, the Cu within the first molten metal region diffuses further into the aluminum sheet 23, the Cu concentration in the portion that was the first molten metal region gradually decreases and the melting point increases, so that solidification proceeds with the temperature held at a constant value. As a result, the insulating substrate 11 and the aluminum sheet 23 are bonded together.

In a similar manner, the Cu within the second molten metal region diffuses further into the aluminum sheet 23 and the top plate section 42, the Cu concentration in the portion that was the second molten metal region gradually decreases and the melting point increases, so that solidification proceeds with the temperature held at a constant value. As a result, the aluminum sheet 23 and the top plate section 42 are bonded together.

In other words, the insulating substrate 11 and the aluminum sheet 23 (the metal layer 13), and the top plate section 42 and the aluminum sheet 23 (the metal layer 13) are bonded by so-called transient liquid phase diffusion bonding. After solidification has occurred, the structure is cooled to normal temperature.

In this manner, the copper sheet 22 (the circuit layer 12), the insulating substrate 11, the aluminum sheet 23 (the metal layer 13) and the top plate section 42 of the heat sink 41 are bonded together, thereby producing the power module substrate 10 and the power module substrate with a heat sink 40 according to the present embodiment.

In the power module substrate 10 and the power module substrate with a heat sink 40 of the present embodiment having the structures described above, the thickness $t_1$ of the circuit layer 12 formed by bonding the copper sheet 22 is within a range of 0.1 mm≤$t_1$≤0.6 mm, the thickness $t_2$ of the metal layer 13 formed by bonding the aluminum sheet 23 is within a range of 0.5 mm≤$t_2$≤6 mm, and the relationship between the thickness $t_1$ of the circuit layer 12 and the thickness $t_2$ of the metal layer 13 satisfies $t_1$<$t_2$, and therefore the insulating substrate 11 is not constrained more than is necessary by the circuit layer 12 formed from the copper sheet 22 with a comparatively large deformation resistance, and the metal layer 13 formed from the aluminum sheet 23 with a comparatively small deformation resistance is satisfactorily thick, meaning stress loaded onto the power module substrate 10 can be moderated, and cracking of the insulating substrate 11 can be suppressed.

Furthermore, because the relationship between the thickness $t_1$ of the circuit layer 12 and the thickness $t_2$ of the metal layer 13 also satisfies $t_2/t_1$≥2.5, specifically $t_2/t_1$=6.67, warping of the power module substrate 10 can also be suppressed.

Further, because the circuit layer 12 having the installation surface on which the semiconductor element 3 is installed is composed of tough pitch copper, the heat generated from the semiconductor element 3 can be satisfactorily dispersed, and dissipation of the heat can be accelerated. Accordingly, the durability when subjected to power cycle loading can be improved.

Moreover, in the present embodiment, because the metal layer 13 is interposed between the heat sink 41 and the insulating substrate 11, thermal strain caused by the difference in the coefficients of thermal expansion of the insulating substrate 11 and the heat sink 41 can be alleviated by deformation of the adequately thick metal layer 13, and therefore cracking of the insulating substrate 11 can be suppressed.

Further, in the present embodiment, because the indentation hardness $H_{B1}$ of the circuit layer 12 in the vicinity of the bonding interface with the insulating substrate 11 is within the range of 60 mgf/μm²≤$H_{B1}$≤120 mgf/μm², the strength of the circuit layer 12 in the vicinity of the bonding interface with the insulating substrate 11 can be ensured, meaning cracking of the circuit layer 12 itself is prevented, whereas the insulating substrate 11 is not strongly constrained by the circuit layer 12, meaning cracking of the insulating substrate 11 can be suppressed.

Furthermore, because the indentation hardness $H_{B2}$ of the metal layer 13 in the vicinity of the bonding interface with the insulating substrate 11 is within the range of 30 mgf/μm²≤$H_{B2}$≤80 mgf/μm², the strength of the metal layer 13 in the vicinity of the bonding interface can be ensured, meaning cracking of the metal layer 13 itself is prevented, whereas the metal layer 13 can deform comparatively readily, meaning stress can be alleviated by deformation of the metal layer 13, and cracking of the insulating substrate 11 can be suppressed.

Furthermore, in the present embodiment, one or more additional elements selected from among Si, Cu, Ag, Zn, Mg, Ge, Ca, Ga and Li exist in solid solution in the vicinity of the bonding interface between the metal layer 13 and the insulating substrate 11, and because Cu exists in solid solution as the additional element in the present embodiment, the portion of the metal layer 13 on the side of the bonding interface undergoes solid solution strengthening, meaning fracture at the metal layer 13 portion can be prevented.

Further, because an additional element high-concentration section in which the concentration of the one or more additional elements selected from among Si, Cu, Ag, Zn, Mg, Ge, Ca, Ga and Li (the Cu concentration in the present embodiment) is two or more times the concentration of the additional elements in the metal layer 13 is formed at the bonding interface between the metal layer 13 and the insulating substrate 11, the existence of these additional element atoms (Cu atoms) in the vicinity of the interface can increase the bonding strength of the metal layer 13.

Moreover, in the present embodiment, one or more additional elements selected from among Si, Cu, Ag, Zn, Mg, Ge, Ca, Ga and Li also exist in solid solution at the bonding interface between the metal layer 13 and the top plate section 42 of the heat sink 41, and because Cu exists in solid solution as the additional element in the present embodiment, the portion of the metal layer 13 on the side of the bonding interface with the top plate section 42 undergoes solid solution strengthening, meaning fracture at the metal layer 13 portion can be prevented.

Further, in the present embodiment, the top plate section 42 of the heat sink 41 is composed of a metal material having a 0.2% proof stress of at least 100 N/mm², and the thickness of the top plate section 42 is at least 2 mm, and because the top plate section 42 is formed from A6063 alloy (an aluminum alloy) in the present embodiment, the rigidity is high, and the handling is favorable. Accordingly, as illustrated in FIG. 1, this top plate section 42 can be secured to the cooling member 43 using the fixing screws 45, and a heat sink 41 having excellent cooling capacity can be formed.

Moreover, because the metal layer 13 formed from an aluminum having a 0.2% proof stress of not more than 30 N/mm² (in the present embodiment, pure aluminum with a purity of at least 99.99%) is disposed between the top plate section 42 of the heat sink 41 and the insulating substrate 11, even if the top plate section 42 of the heat sink 41 has high rigidity, thermal strain caused by the difference in the coefficients of thermal expansion of the top plate section 42 of the heat sink 41 and the insulating substrate 11 can be satisfactorily alleviated by this metal layer 13, and cracking of the insulating substrate 11 can be suppressed.

Further, in the present embodiment, because the insulating substrate 11 is composed of $Al_2O_3$, as described above, the circuit layer 12 formed from tough pitch copper and the insulating substrate 11 can be bonded together using a DBC method which utilizes a eutectic reaction between oxygen and copper. Accordingly, the bonding strength between the insulating substrate 11 and the circuit layer 12 can be ensured, and a power module substrate 10 having excellent bonding reliability can be produced.

Next, a second embodiment of the present invention is described with reference to FIG. 4.

Figure 4:
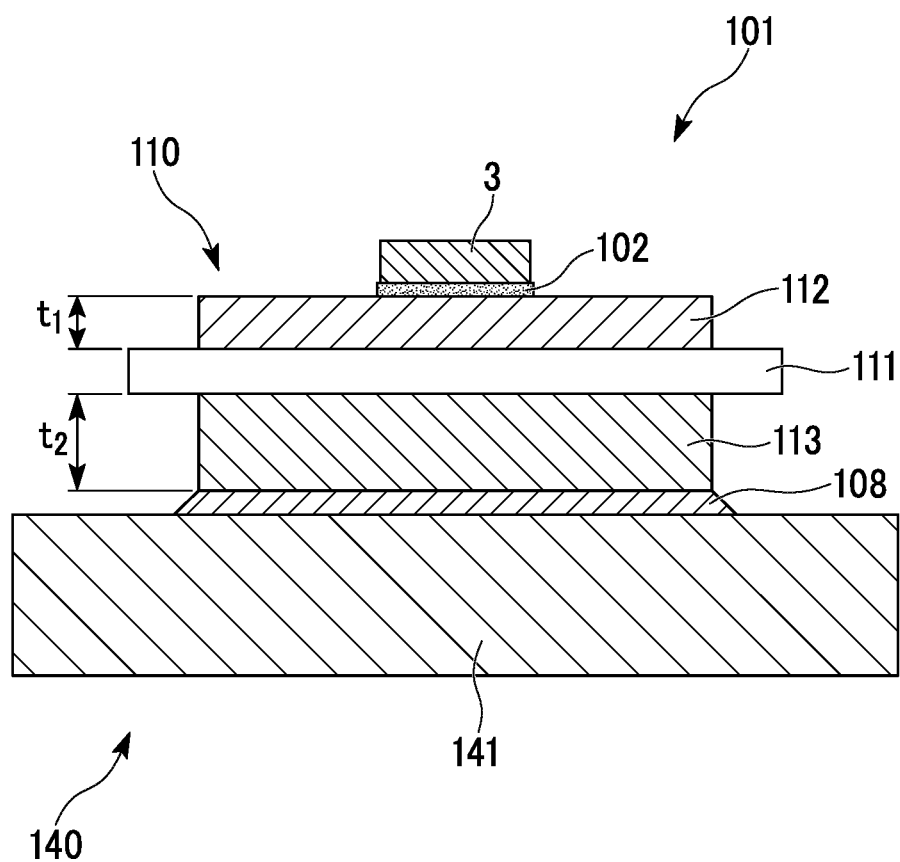
FIG. 4 is a schematic explanatory diagram of a power module using a power module substrate with a heat sink according to a second embodiment of the present invention.

A power module 101 illustrated in FIG. 4 includes a power module substrate with a heat sink 140, and a semiconductor element (electronic component) 3 bonded to one surface (the upper surface in FIG. 4) of this power module substrate with a heat sink 140 via a first solder layer 102. The first solder layer 102 is composed of a Sn—Ag-based, Sn—In-based, or Sn—Ag—Cu-based solder material.

The power module substrate with a heat sink 140 includes a power module substrate 110 and a heat sink 141 which cools the power module substrate 110.

The power module substrate 110 includes an insulating substrate 111, a circuit layer 112 disposed on one surface (the upper surface in FIG. 4) of this insulating substrate 111, and a metal layer 113 disposed on the other surface (the lower surface in FIG. 4) of the insulating substrate 111.

In this embodiment, the insulating substrate 111 is formed from AlN (aluminum nitride). Further, the thickness of the insulating substrate 111 is set within a range from 0.2 mm to 1.5 mm, and in the present embodiment is set to 0.635 mm.

The circuit layer 112 is formed by bonding a copper sheet composed of copper or a copper alloy to one surface of the insulating substrate 111. In this embodiment, a rolled sheet of oxygen-free copper is used as the copper sheet that constitutes the circuit layer 112. A circuit pattern is formed in the circuit layer 112, and one surface (the upper surface in FIG. 4) of that circuit pattern functions as an installation surface onto which the semiconductor element 3 is installed.

The metal layer 113 is formed by bonding an aluminum sheet composed of aluminum or an aluminum alloy to the other surface of the insulating substrate 111. In this embodiment, a rolled sheet of aluminum with a purity of at least 99.0% by mass but not more than 99.85% by mass (so-called 2N aluminum) is used as the aluminum sheet that constitutes the metal layer 113.

In the power module substrate 110 according to the present embodiment, the thickness $t_1$ of the circuit layer 112 is set within a range of $0.1 \text{ mm} \leq t_1 \leq 0.6 \text{ mm}$, the thickness $t_2$ of the metal layer 113 is set within a range of $0.5 \text{ mm} \leq t_2 \leq 6 \text{ mm}$, and the relationship between the thickness $t_1$ of the circuit layer 112 and the thickness $t_2$ of the metal layer 113 satisfies $t_1 < t_2$. The relationship between the thickness $t_1$ of the circuit layer 112 and the thickness $t_2$ of the metal layer 113 preferably also satisfies $t_2/t_1 \geq 2.5$.

In this embodiment, the thickness $t_1$ of the circuit layer 112 is set to $t_1 = 0.3$ mm, and the thickness $t_2$ of the metal layer 113 is set to $t_2 = 2.0$ mm, so that $t_2/t_1 = 6.67$.

Furthermore, the heat sink 141 in the present embodiment is a radiator plate formed from copper, a copper alloy, aluminum, or an aluminum alloy.

This heat sink 141 is bonded to the metal layer 113 of the power module substrate 110 via a second solder layer 108. Further, a Ni plating film not shown in the figure is formed on the surface of the metal layer 113. When the heat sink 141 is formed from aluminum or an aluminum alloy, a Ni plating film is preferably also formed on the surface of the heat sink 141. Further, in a similar manner to the first solder layer 102, the second solder layer 108 can use any of various solder materials, including Sn—Ag-based, Sn—In-based, and Sn—Ag—Cu-based solder materials.

Figure 5:
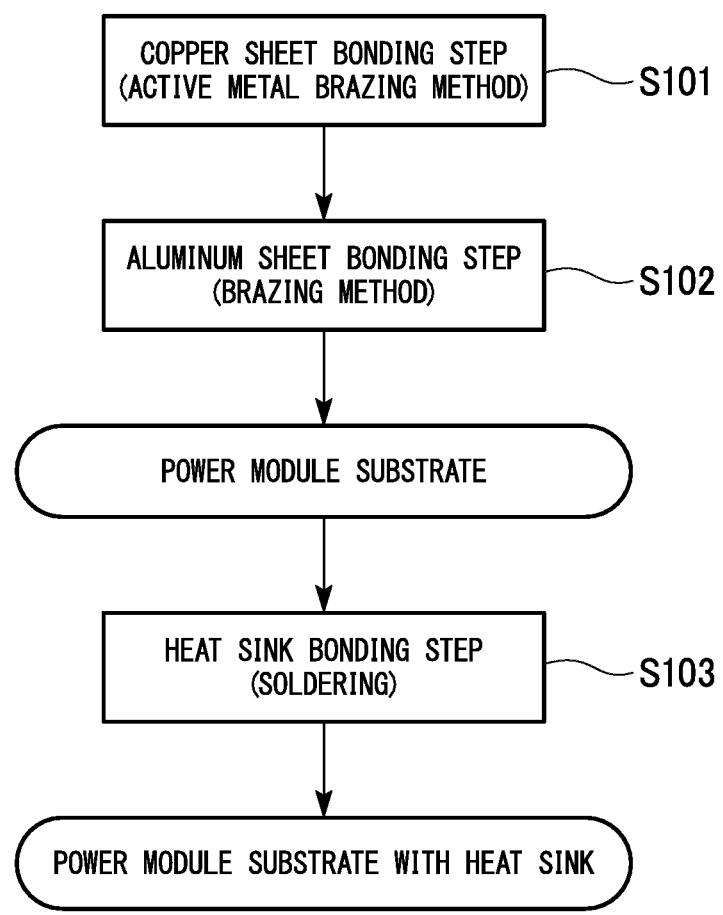
FIG. 5 is a flow chart for a method of producing the power module substrate and the power module substrate with a heat sink according to the second embodiment of the present invention.

A method of producing the power module substrate 110 having the configuration described above and the power module substrate with a heat sink 140 is described below with reference to FIG. 5.

First, the copper sheet that becomes the circuit layer 112 is bonded to the insulating substrate 111 (copper sheet bonding step S101). In this embodiment, the copper sheet composed of the rolled sheet of oxygen-free copper and the insulating substrate 111 are bonded together using a so-called active metal brazing method.

The copper sheet that becomes the circuit layer 112 is laminated to one surface of the insulating substrate 111 via an active brazing material (such as Ag—Cu—Ti), and the insulating substrate 111 and the copper sheet are heated in a heating furnace with a pressure within a range from 1 kgf/cm² to 35 kgf/cm² ($9.8 \times 10^4$ Pa to $343 \times 10^4$ Pa) applied in the lamination direction, thereby bonding the copper sheet that becomes the circuit layer 112 and the insulating substrate 111. The heating temperature is set to 850° C., and the heating time is 10 minutes.

Subsequently, the aluminum sheet that becomes the metal layer 113 is boned to the other surface of the insulating substrate 111 (aluminum sheet bonding step S102).

The insulating substrate 111 and the aluminum sheet are laminated together with a brazing material disposed therebetween, and the insulating substrate 111 and the aluminum sheet are bonded together by brazing. At this time, for example, an Al—Si-based brazing foil having a thickness of 20 to 110 µm can be used as the brazing material, and the brazing temperature is preferably from 600 to 620° C.

As a result, the power module substrate 110 of the present embodiment is produced.

Next, the power module substrate 110 and the heat sink 141 are bonded together (heat sink bonding step S103). In this heat sink bonding step S103, first, a Ni plating film is formed on the bonding interface of the metal layer 113 of the power module substrate 110 with the heat sink 141, and the heat sink 141 and the metal layer 113 are then bonded together using a solder material.

By so doing, the solder layer 108 is formed between the metal layer 113 and the heat sink 141, thereby producing the power module substrate with a heat sink 140 according to the present embodiment.

In the power module substrate with a heat sink 140 of the present embodiment having the configuration described above, cracking of the insulating substrate 111 and warping of the power module substrate 110 and the like can be suppressed in a similar manner to that described for the first embodiment.

Moreover, in the present embodiment, because the circuit layer 112 is formed from a copper sheet, and the thickness $t_1$ of this circuit layer 112 is set within a range of 0.1 mm≤$t_1$≤0.6 mm, or more specifically 0.3 mm, the rigidity of the entire power module substrate 110 can be ensured, the power module substrate 110 is resistant to deformation during thermal cycle loading, and cracking of the second solder layer 108 can be suppressed.

In particular, in the present embodiment, because the metal layer 113 is formed from a rolled sheet of aluminum with a purity of at least 99.0% by mass but not more than 99.85% by mass (so-called 2N aluminum), the metal layer 113 does not deform easily during thermal cycle loading, and therefore cracking in the second solder layer 108 can be reliably suppressed.

Although embodiments of the present invention have been described above, the present invention is in no way limited by these embodiments, and suitable modifications can be made without departing from the technical scope of the present invention.

For example, the aluminum sheet that becomes the metal layer was described as being either a rolled sheet of pure aluminum having a purity of at least 99.99% by mass, or a rolled sheet of aluminum having a purity of at least 99.0% by mass but not more than 99.85% by mass, but the present invention is not limited to these configurations, and an aluminum sheet formed from another aluminum or an aluminum alloy may also be used.

Similarly, the copper sheet that becomes the circuit layer was described as being either a rolled sheet of tough pitch copper or a rolled sheet of oxygen-free copper, but the present invention is not limited to these configurations, and a copper sheet formed from another copper or a copper alloy may also be used.

Further, a radiator plate was described as the heat sink, but the present invention is not limited to this configuration, and a radiator plate fitted with heat radiation fins, or a cooling unit having an internal channel through which a cooling medium is circulated may also be used.

Furthermore, a configuration in which the ceramic substrate was composed of $Al_2O_3$ and the copper sheet was bonded using a DBC method, and a configuration in which the ceramic substrate was composed of AlN and the copper sheet was bonded using an active metal brazing method were described, but the present invention is not limited to these configurations, and the ceramic substrate may also be composed of $Si_3N_4$. Further the invention is not limited to bonding methods between a ceramic substrate and a copper sheet.

Figure 6:
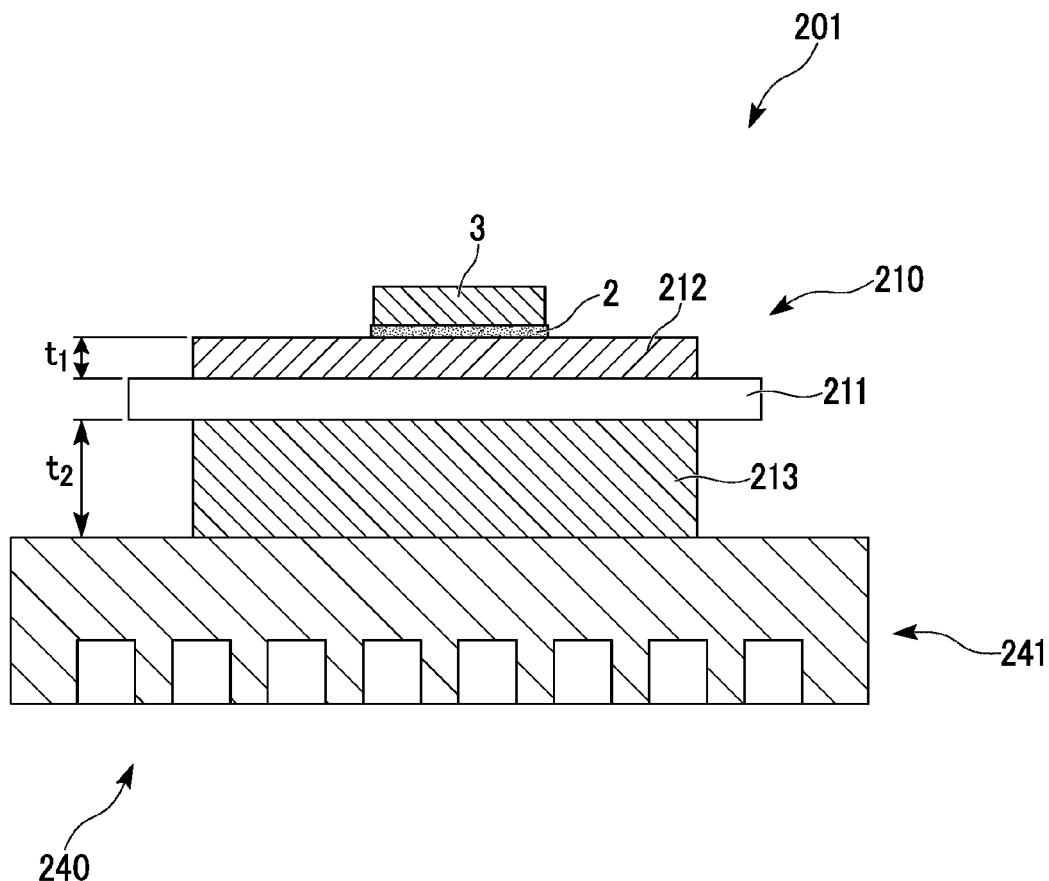
FIG. 6 is a schematic explanatory diagram of a power module using a power module substrate according to another embodiment of the present invention.
Figure 7:
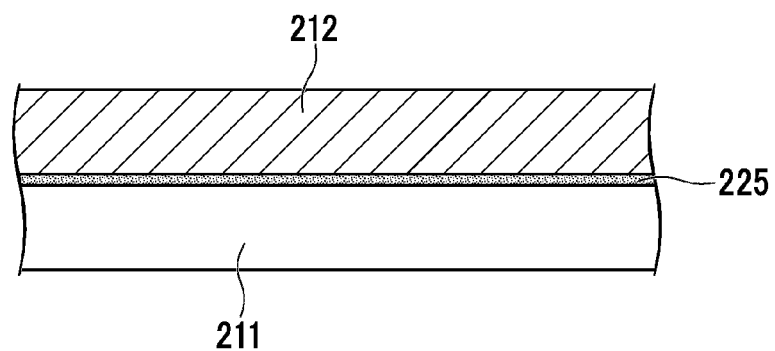
FIG. 7 is an enlarged explanatory diagram of the circuit layer and the insulating substrate of the power module substrate according to the other embodiment.

For example, as shown in a power module 201 illustrated in FIG. 6 and FIG. 7, a configuration may be used in which a ceramic substrate 211 is composed of AlN (aluminum nitride), an $Al_2O_3$ layer 225 is formed on one surface of this ceramic substrate 211, and the $Al_2O_3$ layer 225 and a copper sheet are bonded together using the DBC method to form a circuit layer 212. The thickness of the $Al_2O_3$ layer 225 is preferably at least 1 µm. This $Al_2O_3$ layer 225 can be formed by subjecting the AlN to an oxidation treatment at a temperature of 1,200° C. or higher in an Ar—$O_2$ mixed gas atmosphere. By performing the AlN oxidation treatment in a high-oxygen partial pressure/low-water vapor partial pressure atmosphere in which the oxygen partial pressure $P_{O2}$ is set to 10 kPa and the water vapor partial pressure $P_{H2O}$ is adjusted to 0.05 kPa, a dense $Al_2O_3$ layer 225 which exhibits excellent adhesion to AlN is formed.

Further, in the first embodiment, the ceramic substrate and the metal layer composed of aluminum or an aluminum alloy, and the metal layer composed of aluminum or an aluminum alloy and the heat sink composed of aluminum or an aluminum alloy were described as being bonded together using transient liquid phase diffusion bonding, but the present invention is not limited to this method, and bonding may also be performed using a brazing material such as an Al—Si-based alloy.

Moreover, in the first embodiment, the heat sink was described as having a structure containing a top plate section and a cooling member, but the present invention is not limited to this configuration, and the heat sink may also be composed of a radiator plate fitted with heat radiation fins, or a cooling unit having an internal channel through which a cooling medium is circulated.

EXAMPLES

Example 1

A comparative test conducted to confirm the effectiveness of the present invention is described below.

As shown in Table 1, power module substrates were prepared by bonding together an insulating substrate, a copper sheet that becomes the circuit layer, and an aluminum sheet that functions as the metal layer.

The size of the circuit layer was 37 mm×37 mm, the size of the insulating substrate was 40 mm×40 mm, and the size of the metal layer was 37 mm×37 mm.

For the "active metal brazing" indicated in Table 2, an active brazing material composed of Ag-27.4% by mass Cu-2.0% by mass Ti was used to bond the copper sheet and the insulating substrate by heating at 850° C. for 10 minutes in a vacuum of $10^{-3}$ Pa.

For the "DBC" indicated in Table 2, the copper sheet and the insulating substrate were bonded by heating at 1,075° C. for 10 minutes in a nitrogen gas atmosphere.

For the "TLP" indicated in Table 2, Cu was adhered to the surface of the insulating substrate in an amount of 1.0 mg/cm$^2$, and the aluminum sheet and the insulating substrate were then bonded by heating at 600° C. for 30 minutes in a vacuum of $10^{-3}$ Pa with a pressure of 5 kgf/cm$^2$ applied in the lamination direction.

For the "Al—Si brazing" indicated in Table 2, a brazing material foil (a thickness of 100) composed of Al-7.5% by mass Si was used to bond the aluminum sheet and the insulating substrate by heating at 650° C. for 30 minutes in a vacuum of $10^{-3}$ Pa with a pressure of 12 kgf/cm$^2$ applied in the lamination direction.

Further, a heat sink was bonded to the other surface of the metal layer in the above power module substrates. The heat sink was an aluminum plate of A3003 alloy with dimensions of 50 mm×60 mm×5 mmt. The bonding conditions involved using an Al—Si brazing foil, and performing bonding by heating at 610° C. in a vacuum while a pressure of 3.0 kgf/cm$^2$ was applied.

Using the power module substrates with a heat sink obtained in this manner, a cooling-heating cycle test was performed. The results of these evaluations are shown in Table 2. An observation was made after every 500 cycles, and the number of cycles at which cracking of the insulating substrate was confirmed was recorded as the evaluation result. The measurement conditions were as follows.

Evaluation apparatus: TSB-51 manufactured by Espec Corporation

Liquid phase: Fluorinert

Temperature conditions: one repetition of −40° C.×5 minutes and one repetition of 125° C.×5 minutes represents a single cycle Moreover, an IGBT element was soldered to one surface of the circuit layer of each of these power module substrates. This soldering used a Sn—Ag—Cu-based solder, and bonding was performed at 300° C. in a hydrogen reducing atmosphere.

Power cycle tests were then performed using the power module substrates obtained in this manner.

The results of the evaluations are shown in Table 2. The power cycle value was evaluated as the percentage increase in the thermal resistivity after 100,000 repetitions of loading.

The thermal resistance was measured in the manner described below. Namely, a heater chip was heated with 100 W of electrical power, and the temperature of the heater chip was measured using a thermocouple. Further, the temperature of the cooling medium (ethylene glycol:water=9:1) circulating through the heat sink was also measured. Then, the value of the difference between the temperature of the heater chip and the temperature of the cooling medium divided by the electrical power was recorded as the thermal resistance.

The measurement conditions were as follows.

Temperature difference: 80° C.

Temperature range: 55° C. to 135° C. (measured by a temperature-sensing diode inside the IGBT element)

Power application time: 6 seconds

Cooling time: 4 seconds

TABLE 1

| | Circuit layer | | Metal layer | | Thickness ratio | Ceramic | |
|---|---|---|---|---|---|---|---|
| | Material | Thickness $t_1$ | Material | Thickness $t_2$ | $t_2/t_1$ | Material | Thickness |
| Invention Example 1 | OFC | 0.3 mm | A1050 | 1.5 mm | 5.00 | Al$_2$O$_3$ | 0.32 mm |
| Invention Example 2 | OFC | 0.3 mm | A1080 | 2.2 mm | 7.33 | Si$_3$N$_4$ | 0.32 mm |
| Invention Example 3 | 6N—Cu | 0.4 mm | 4N—Al | 1.6 mm | 4.00 | AlN | 0.635 mm |
| Invention Example 4 | 6N—Cu | 0.5 mm | A1080 | 2.5 mm | 5.00 | Si$_3$N$_4$ | 0.32 mm |
| Invention Example 5 | tough pitch Cu | 0.3 mm | 4N—Al | 1.6 mm | 5.33 | AlN | 0.635 mm |
| Invention Example 6 | tough pitch Cu | 0.5 mm | A1080 | 1.6 mm | 3.20 | Si$_3$N$_4$ | 0.32 mm |
| Invention Example 7 | OFC | 0.4 mm | 4N—Al | 0.8 mm | 2.00 | AlN | 0.635 mm |
| Invention Example 8 | OFC | 0.3 mm | 4N—Al | 0.5 mm | 1.67 | AlN | 0.635 mm |
| Comparative Example 1 | OFC | 0.7 mm | 4N—Al | 2.0 mm | 2.86 | AlN | 0.635 mm |
| Comparative Example 2 | 6N—Cu | 0.3 mm | A1080 | 0.2 mm | 0.67 | Al$_2$O$_3$ | 0.32 mm |
| Comparative Example 3 | tough pitch Cu | 0.4 mm | A1050 | 0.4 mm | 1.00 | Al$_2$O$_3$ | 0.32 mm |
| Comparative Example 4 | 4N—Al | 0.6 mm | 4N—Al | 2.1 mm | 3.50 | AlN | 0.635 mm |
| Comparative Example 5 | 4N—Al | 0.4 mm | A1050 | 2.1 mm | 5.25 | Al$_2$O$_3$ | 0.32 mm |
| Comparative Example 6 | 4N—Al | 0.9 mm | A1080 | 1.1 mm | 1.22 | Si$_3$N$_4$ | 0.32 mm |

TABLE 2

| | Circuit layer/ insulating substrate bonding method | Metal layer/ insulating substrate bonding method | Cooling- heating cycle | Power cycle |
|---|---|---|---|---|
| Invention Example 1 | Active metal brazing | Al—Si brazing | >4,000 | 0.59% |
| Invention Example 2 | Active metal brazing | TLP | >4,000 | 2.60% |
| Invention Example 3 | Active metal brazing | TLP | >4,000 | 1.86% |
| Invention Example 4 | Active metal brazing | TLP | >4,000 | 1.22% |
| Invention Example 5 | DBC | Al—Si brazing | >4,000 | 3.54% |
| Invention Example 6 | Active metal brazing | TLP | >4,000 | 0.84% |
| Invention Example 7 | Active metal brazing | Al—Si brazing | <3,000 | 1.34% |
| Invention Example 8 | Active metal brazing | Al—Si brazing | <3,000 | 0.53% |
| Comparative Example 1 | Active metal brazing | Al—Si brazing | <500 | 0.50% |
| Comparative Example 2 | Active metal brazing | Al—Si brazing | <1,000 | 3.65% |
| Comparative Example 3 | DBC | Al—Si brazing | <2,000 | 2.21% |
| Comparative Example 4 | Al—Si brazing | Al—Si brazing | >4,000 | 18.30% |
| Comparative Example 5 | Al—Si brazing | Al—Si brazing | >4,000 | 17.60% |
| Comparative Example 6 | TLP | TLP | >4,000 | 20.40% |

In Comparative Example 1 in which the thickness of the copper sheet that becomes the circuit layer was 0.7 mm, cracking of the insulating substrate was detected after less than 500 cycles of the cooling-heating cycle test.

In Comparative Example 2, in which the copper sheet that becomes the circuit layer was formed with a greater thickness than that of the aluminum sheet that becomes the metal layer, cracking of the insulating substrate was detected after less than 1,000 cycles of the cooling-heating cycle test. Moreover, an increase in the thermal resistance was also observed in the power cycle test.

In Comparative Example 3, in which the thickness of the copper sheet that becomes the circuit layer and the thickness of the aluminum sheet that becomes the metal layer were equal, cracking of the insulating substrate was detected after less than 2,000 cycles of the cooling-heating cycle test. Moreover, an increase in the thermal resistance of several percent was also observed in the power cycle test.

In Comparative Examples 4 to 6 in which the circuit layer was formed from an aluminum sheet, although the results of the cooling-heating cycle test were favorable, large increases in the thermal resistance were confirmed in the power cycle test.

In contrast, in Invention Examples 1 to 8, no cracking of the insulating substrate was detected even after more than 2,500 cycles in the cooling-heating cycle test. Further, it was also confirmed that increases in the thermal resistance were able to be suppressed in the power cycle test. In particular, in Invention Examples 1 to 6, in which the ratio $t_2/t_1$ between the thickness $t_1$ of the circuit layer and the thickness $t_2$ of the metal layer was 2.5 or greater, no cracking of the insulating substrate was observed even after more than 4,000 cycles in the cooling-heating cycle test.

The above results confirmed that the present invention was able to provide a power module substrate, a power module substrate with a heat sink and a power module, which can promote the dissipation of heat from a heat-generating body such as an electronic component installed on the circuit layer, have excellent power cycle characteristics, and have superior reliability capable of suppressing cracking of the insulating substrate during cooling-heating cycle loading.

Example 2

Next, the metal layer of the power module substrate and the heat sink were bonded together via a second solder layer, as described above in the second embodiment, and the bonding ratio in this second solder layer was evaluated.

As shown in Table 3, power module substrates were prepared by bonding an insulating substrate, a copper sheet that becomes the circuit layer, and an aluminum sheet that functions as the metal layer.

The size of the circuit layer was 37 mm×37 mm, the size of the insulating substrate was 40 mm×40 mm, and the size of the metal layer was 37 mm×37 mm.

The "active metal brazing" "DBC", "TLP" and "Al—Si brazing" indicated in Table 4 refer to the same bonding methods as those described above in Example 1 and Table 2.

A heat sink was bonded to the other surface of the metal layer in the above power module substrates. The heat sink was an aluminum plate of A6063 alloy with dimensions of 50 mm×60 mm×5 mmt. The heat sink was bonded using an Sn—Sb-based solder, by performing soldering by holding the structure in a $H_2$ atmosphere at 200° C. for 5 minutes and then at 300° C. for 10 minutes, subsequently replacing the atmosphere with a $N_2$ atmosphere, and then cooling the bonded structure.

Using the power module substrates with a heat sink obtained in this manner, a cooling-heating cycle test was performed. The cooling-heating cycle conditions were the same as those described above for Example 1, and 2,000 cooling-heating cycles were performed.

The bonding ratio in the second solder layer was measured after initial bonding, and then following the 2,000 cycles of cooling-heating cycle loading. The results of these evaluations are shown in Table 4.

TABLE 3

|  | Circuit layer | | Metal layer | | Thickness ratio | Ceramic | |
| --- | --- | --- | --- | --- | --- | --- | --- |
|  | Material | Thickness $t_1$ | Material | Thickness $t_2$ | $t_2/t_1$ | Material | Thickness |
| Invention Example 11 | OFC | 0.3 mm | A1050 | 0.9 mm | 3.00 | AlN | 0.635 mm |
| Invention Example 12 | OFC | 0.6 mm | A1100 | 1.5 mm | 2.50 | $Si_3N_4$ | 0.32 mm |
| Invention Example 13 | tough pitch Cu | 0.3 mm | A1050 | 1.6 mm | 5.33 | $Al_2O_3$ | 0.38 mm |
| Invention Example 14 | 6N—Cu | 0.4 mm | A1080 | 2.1 mm | 5.25 | AlN | 0.5 mm |
| Comparative Example 11 | 4N—Al | 0.6 mm | 4N—Al | 2.1 mm | 3.50 | AlN | 0.635 mm |

TABLE 4

|  | Circuit layer/ insulating substrate bonding method | Metal layer/ insulating substrate bonding method | Second solder layer bonding ratio (%) | |
| --- | --- | --- | --- | --- |
|  |  |  | Initial bonding | Following cooling-heating cycles |
| Invention Example 11 | Active metal brazing | Al—Si brazing | 99.0 | 98.5 |
| Invention Example 12 | Active metal brazing | TLP | 98.5 | 98.0 |
| Invention Example 13 | DBC | Al—Si brazing | 99.5 | 95.6 |
| Invention Example 14 | Active metal brazing | TLP | 98.6 | 97.3 |
| Comparative Example 11 | Al—Si brazing | Al—Si brazing | 99.8 | 77.3 |

In Comparative Example 11, in which the circuit layer and the metal layer were both formed from aluminum sheets, the bonding ratio following the cooling-heating cycles deteriorated significantly. This is assumed to be due to cracking of the second solder layer.

In contrast, in Invention Examples 11 to 14, no significant deterioration in the bonding ratio was observed following the cooling-heating cycles. Accordingly, in Invention Examples 11 to 14, it was confirmed that cracking in the second solder layer was able to be suppressed.

DESCRIPTION OF THE REFERENCE SIGNS 1, 101, 201: Power module
3: Semiconductor element (electronic component)
10, 110, 210: Power module substrate
11, 111, 211: Insulating substrate
12, 112, 212: Circuit layer
13, 113, 213: Metal layer
22: Copper sheet
23: Aluminum sheet
40, 140, 240: Power module substrate with heat sink
41, 141, 241: Heat sink
225: $Al_2O_3$ layer

The invention claimed is:

1. A power module substrate comprising:
an insulating substrate, a circuit layer formed on one surface of the insulating substrate, and a metal layer formed on an other surface of the insulating substrate, wherein
the circuit layer is composed of oxygen-free copper (OFC) or 6N—Cu, and one surface of this circuit layer functions as an installation surface on which an electronic component is installed,
the metal layer is formed by bonding an aluminum sheet composed of aluminum or an aluminum alloy,
a thickness $t_1$ of the circuit layer is within a range of 0.1 mm $<t_1<$0.6 mm,
a thickness $t_2$ of the metal layer is within a range of 0.5 mm $<t_2<$6 mm,
a relationship between the thickness $t_1$ of the circuit layer and the thickness $t_2$ of the metal layer satisfies $t_1<t_2$,
a relationship between the thickness $t_1$ of the circuit layer and the thickness $t_2$ of the metal layer is $t_2/t_1 \geq 4.00$, and
an indentation hardness $H_{B1}$ of the circuit layer in a vicinity of an bonding interface with the insulating substrate is set within a range of 60 mgf/$\mu m^2 \leq H_{B1} \leq$120 mgf/$\mu m^2$.

2. A power module substrate according to claim 1, wherein an indentation hardness $H_{B2}$ of the metal layer in a vicinity of an bonding interface with the insulating substrate is set within a range of 30 mgf/$\mu m^2 \leq H_{B2} \leq$80 mgf/$\mu m^2$.

3. A power module substrate according to claim 1, wherein the metal layer is formed from a rolled sheet of aluminum with a purity of 99.0% by mass to 99.85% by mass.

4. A power module substrate according to claim 1, wherein the relationship between the thickness $t_1$ of the circuit layer and the thickness $t_2$ of the metal layer is $t_2/t_1 \geq 5.25$.

5. A power module substrate according to claim 1, wherein the relationship between the thickness $t_1$ of the circuit layer and the thickness $t_2$ of the metal layer is $t_2/t_1 \leq 10$.

6. A power module substrate with a heat sink, comprising the power module substrate according to claim 1, and a heat sink bonded to the metal layer side of the power module.

7. The power module substrate with a heat sink according to claim 6, wherein the heat sink and the metal layer are bonded via a solder layer.

8. A power module, comprising the power module substrate according to claim 1, and an electronic component installed on the circuit layer.

* * * * *